United States Patent [19]

Lündqvist

[11] Patent Number: 4,514,746
[45] Date of Patent: Apr. 30, 1985

[54] APPARATUS FOR COOLING TELECOMMUNICATIONS EQUIPMENT IN A RACK

[75] Inventor: Gösta B. Lündqvist, Johanneshov, Sweden

[73] Assignee: Flakt Aktiebolag, Nacka, Sweden

[21] Appl. No.: 445,983

[22] Filed: Dec. 1, 1983

[51] Int. Cl.³ .............................................. H05H 7/20
[52] U.S. Cl. ................................... 361/385; 62/418; 62/522; 361/415
[58] Field of Search ............... 361/380, 382, 383, 384, 361/385, 386, 415; 62/418, 520, 443, 522

[56] References Cited

U.S. PATENT DOCUMENTS

| | | | |
|---|---|---|---|
| 3,144,079 | 8/1964 | Mack | 62/520 |
| 3,165,150 | 1/1965 | Hurst et al. | 62/522 |
| 3,289,047 | 11/1966 | Pick | 361/415 |
| 3,317,798 | 5/1967 | Chu et al. | 361/384 |
| 3,334,684 | 8/1967 | Roush et al. | 361/385 |
| 3,481,393 | 12/1969 | Chu | 361/385 |
| 3,754,596 | 8/1973 | Ward | 361/385 |
| 3,852,805 | 12/1974 | Brzozowski | 357/82 |
| 3,942,586 | 3/1976 | Fries | 361/384 |
| 4,145,708 | 3/1979 | Ferro et al. | 357/82 |
| 4,203,129 | 5/1980 | Oktay et al. | 357/82 |
| 4,315,300 | 2/1982 | Parmerlee et al. | 361/382 |
| 4,352,274 | 10/1982 | Anderson et al. | 62/418 |

FOREIGN PATENT DOCUMENTS

| | | |
|---|---|---|
| 2138376 | 6/1977 | Fed. Rep. of Germany ...... 361/384 |
| 79042719 | 1/1981 | Sweden . |
| 1006053 | 9/1965 | United Kingdom . |
| 1336076 | 11/1973 | United Kingdom . |
| 1521464 | 8/1978 | United Kingdom . |
| 1563091 | 3/1980 | United Kingdom . |
| 2045537 | 10/1980 | United Kingdom . |

OTHER PUBLICATIONS

IBM Technical Disclosure Bulletin, vol. 21, No. 6, Nov. 1978, p. 2432.

*Primary Examiner*—A. D. Pellinen
*Assistant Examiner*—Gregory D. Thompson
*Attorney, Agent, or Firm*—Dann, Dorfman, Herrell and Skillman

[57] ABSTRACT

A rack contains a number of shelves arranged on top of each other, which carry, among other things, board magazines with printed circuit boards. An apparatus for cooling the aforesaid printed circuit boards containing telecommunications or electronic equipment in each rack is based on the principle that one or more shelves in the rack are integrated each with its own heat exchanger, which is equipped with cooling flanges and at least one tubular coil. The heat exchanger is connected to a cooler for a coolant. The heat exchanger covers the greater part of the horizontal plane of the shelf. Heat-transfer members with extensive heat-conducting contact surfaces are provided between the board magazines and the body of the shelf and between the latter and the heat exchangers. Each heat exchanger and the cooler are arranged to permit a high packing density of the aforesaid telecommunications equipment in the rack and to contribute towards removing heat emitted by the equipment by means of heat conduction via the aforesaid heat-transfer members. In one embodiment (FIG. 7), the total shelf cooling function provides for the aforesaid removal of heat unassisted. This heat removal is also provided for by natural convection at the hot and cold surfaces and by radiation. In a second embodiment (FIG. 1), the shelf cooling function is combined with a row cooling function (open or closed), air conditioner or similar installation.

13 Claims, 10 Drawing Figures

Fig. 7

APPARATUS FOR COOLING TELECOMMUNICATIONS EQUIPMENT IN A RACK

TECHNICAL FIELD

The present invention relates to an apparatus for cooling telecommunications equipment mounted in a rack with a number of shelves located on top of each other, which equipment consists of component-carrying printed circuit boards housed in board magazines, which are in turn applied to the aforesaid shelves. The term "telecommunications equipment" is also used here to denote general electronic equipment mounted in racks that is used outside of the field of telecommunications as well.

DESCRIPTION OF THE PRIOR ART

A means of achieving cooling of telecommunications equipment mounted in one or more racks, for example at a telephone exchange, is already known. Such a rack may contain eight shelves, and two such racks generally form a so-called "double rack". The board magazines that are applied to the aforesaid shelves are thereby arranged to store, on end, a number of boards with printed circuits and/or components, such as relays, condensers, resistors, inductances etc. A magazine may contain 50 such boards, which means that a double rack may contain some 1,000 boards.

Heretofore, it has been proposed to cool such telecommunications equipment solely with the aid of so-called "open cooling systems", which comprise a compressed air source, for example in the form of a fan, whose initiated air stream is conducted from an air duct at the lower parts of the rack or racks and upwards in each rack so that it can pass the boards placed on end in the board magazines and be discharged at the top of the rack or racks out into the premises. The air is recirculated to a cooling unit, where the air can be cooled and dried before it is once again recirculated to the racks, and so on.

DESCRIPTION OF THE PRESENT INVENTION

Technical Problem

A fervent desire exists to be able to increase the density of components on each printed circuit board so that a larger number of components can be accommodated within the same volume. This results in heat output from the boards in the racks that is difficult to handle with present-day cooling equipment for telecommunication racks. The heat outputs in question can be up to 10 Watts per board or more.

In light of the above, new ways must be chosen to obtain heat removal from the board magazines so that maximum component temperatures can be kept to a reasonable level, a must in order to ensure good function and long life of the components in question.

Solution

The main purpose of the present invention is to create an apparatus that solves the problem of efficient removal of the heat emitted by the printed circuit board components. What can thereby be said to be essentially characteristic for the new apparatus is that one or more shelves are integrated, each with its own heat exchanger incorporating cooling flanges and at least one tubular coil, which is connected via the heat exchanger to a cooler for supplying a coolant to the tubular coil; that the heat exchanger, viewed in the horizontal plane of the shelf, extends along at least one half of the length and width of the shelf preferably occupying 60% to 90% of the area of the shelf; that heat transfer members with extensive heat-conducting metallic contact surfaces are arranged between the board magazines and the shelf and between the shelf and the heat exchanger; and that the aforesaid heat exchanger and cooler are designed to remove the aforementioned emitted heat even at a high packing density of the aforesaid telecommunications equipment in the rack and a high heat output from the said equipment, partly with the aid of heat conduction through the aforesaid extensive contact surfaces.

In further elaborations of the invention concept more detailed, specifications are recommended for the construction of the different parts of the apparatus. Thus, in one proposed embodiment for the majority of the shelves in the rack, each shelf is equipped with its own heat exchanger, in addition to which the tubular coils of the separate heat exchangers are interconnected and preferably connected by coolant lines to one and the same cooler. The cooler with appurtenant compressor may thereby take the form of a tubular evaporator or fluid cooler that is incorporated in a cooling circuit together with, a condenser (or water recooler). The latter, at least, should be located outside of the premises or work space in which the rack or racks are set up.

The heat exchanger or heat exchangers and the appurtenant cooling equipment are thereby arranged and operated in such a manner that the surface temperatures of the components on the boards assume values that are acceptable in the context, for example not above about 75° C. The heat exchangers and the cooling equipment should preferably be arranged in such a manner that most of the components on each board assume relatively low temperatures, e.g. below 65° C. In principle, it is possible to arrange and operate the equipment in such a manner that lower component temperatures are achieved. In order to effect the above, each heat exchanger should be provided with a relatively large effective cooling surface area, in one embodiment preferably in excess of about 1.5 m$^2$. As an example, it can be mentioned that the cooling surface area can be chosen with the range 1.5 to 4.0 m$^2$. Each heat exchanger shall be provided with a relatively large cooling capacity, e.g. in excess of 150 Watts, and in this context it can be mentioned that the invention makes it possible to achieve very high cooling capacities from each heat exchanger, for example 500 Watts or more.

The integration between each heat exchanger and its associated shelf is further designed so that there is no undue mechanical weakening of the load-bearing capacity of the shelf, but rather the shelf can fulfil its board-bearing functions.

According to the invention concept, the new apparatus shall be able to effect the cooling function essentially autonomously, i.e. without the aid of additional cooling equipment, for example in the form of row coolers, air conditioners and the like. It is, however, possible, if desired, to use the apparatus in combination with other cooling equipment, for example a row cooler.

Through the invention, the rack or racks that make use of the new apparatus will, in one embodiment, function as a cooling buffer in the premises or work space where the rack or racks are set up, while simultaneously cooling the telecommunications equipment in the rack or racks.

In accordance with the concept of the invention, each shelf shall contain a horizontally extending cavity or opening in which the heat exchanger for that shelf is mounted by means of a holding device. This holding device which also serves as a heat-transfer member may take the form of a screen or grille running along the outer sides of the heat exchanger and be fastened along at least its long sides to the shelf. The shelf thereby consists of two essentially parallel load-bearing parts or beams, held together at their ends by side pieces and brackets, which can be of known type. The aforesaid cavity for the heat exchanger extends between the aforesaid parallel load-bearing parts. Cantilever supports also extend between the aforesaid load-bearing parts, and the middle sections of the cantilever supports extend over the aforesaid cavity or opening. The cantilever supports in turn support the board magazines and serve as heat-transfer members. The boards are placed on end in the board magazines and are enclosed entirely within the aforesaid board magazines. The board magazines are provided with through slots to permit air circulation past the sides of the boards and components. The board magazines incorporate a bottom part that supports the receptacles into which the boards can be inserted via matching plugs. The bottom part is also provided with through slots that permit air circulation.

Metallic contact surfaces thereby exist between the shelf and the aforesaid holding device for the heat exchanger and between the shelf and the board magazines. The extended contact surfaces are also situated on, the aforesaid cantilever supports. In one embodiment, the extended contact surfaces also include long channels by means of which the holding device for the heat exchanger is clamped to the shelf. The board magazines, the cantilever supports, the holding device for the heat exchanger and/or the shelf itself can, in addition, be in direct contact for example through metallic plates, with the cooling system's lines or coils, whereby direct heat transfer contact is also obtained between the cold surfaces on the aforesaid lines and the unit in question.

Advantages

The above-described arrangement provides an effective indirect cooling function for the board components in the board magazines to complement the cooling function that is obtained through natural convection and radiation from the heat exchanger.

Through the proposed design principle, relatively large quantities of heat can be dissipated in this context by means of the heat exchanger and the appurtenant cooling equipment. Even if as large heat outputs as 10–15 Watts should be emitted from one or more boards in the board magazines, the design and operation of the heat exchangers and the appurtenant cooling equipment can be arranged to provide the necessary heat removal. The new arrangement can thereby effect removal of the heat developed in the racks without environmental nuisance, either by itself or in combination with supplementary cooling equipment, such as row coolers and air conditioners.

Despite a high packing density, the highest temperatures of the boards need not exceed predetermined values, e.g. about 75° C. Obviously, the life of the various components is prolonged by reduced temperature, and it can be mentioned in this context that if desired, it is possible to operate the system so that the temperatures of most of the components will be around 65° C. or lower.

Despite the above-mentioned advantages obtained with the invention, the main advantage is that the shelf construction and the rack system as a whole need not be subject to any modifications, aside from provision of the cavity or opening for the heat exchanger. The heat exchangers in the rack will therefore not occupy any extra space, but rather only such space as was previously not utilized in the racks of known design. The integration can be executed in such a manner that the load-bearing capacity of the shelf is not unduly affected.

DESCRIPTION OF THE DRAWINGS

A currently proposed embodiment of an apparatus that exhibits the significant characertistics of the invention will be described below with reference to appended drawings, where.

DESCRIPTION OF THE PREFERRED EMBODIMENT

Figure 1:
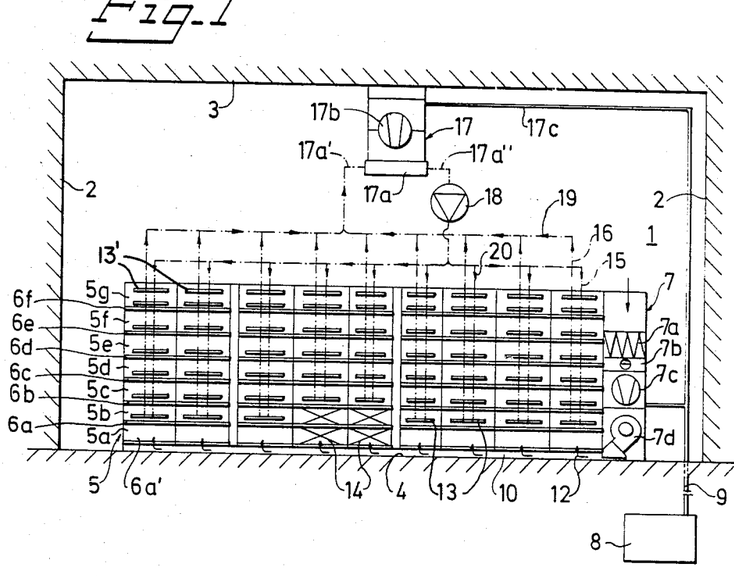
FIG. 1 shows, in schematic form premises, for example at a telephone exchange, with racks containing telecommunications equipment that is cooled by the new apparatus, the latter comprising a combination of shelf coolers and row coolers.

FIGS. 1–6 illustrate an embodiment where the individual cooling function in the rack shelves has been combined with a row cooling function common to all racks. In FIG. 1, the premises or equivalent work space are indicated by 1. The premises are bounded in this case by walls 2, a ceiling 3 and the floor 4. A number of racks 5 of known type with telecommunications equipment are set up on the presmises. The racks 5 shown are arranged in rows and the premises may contain one or more such rows of racks. Each rack consists of a number of compartments arranged on top of one another, designated in the figure by 5a, 5b . . . 5g. The compartments are bounded by shelves, which are indicated by 6a', 6a, 6b . . . 6f. The shelves are designed to support various telecommunication units plus magazines with boards with printed wiring and various components (condensers, relays, resistors etc.). By "shelf" is meant here cantilevers and the like. The aforesaid boards are arranged on end in the magazines.

At the end of each row is a refrigeration module 7 that operates by means of, for example, direct expansion and is conventional. The refrigeration module in question here is sold on the market by Fläkt AB and carries the code designation KDAX. The refrigeration module comprises a filter 7a, a cooling coil 7b, compressors 7c and a fan 7d. The compressors are connected to a condenser 8 or water cooler located outside of the premises, and the refrigerant or coolant line is indicated by 9. One or more ducts 10 pass under the racks.

The air discharged by the fan 7d is blown into the aforesaid ducts and distributed in known manner between the racks, creating upward-directed and preferably dry air streams, indicated in the figure by 12.

Heat exchangers, described in greater detail below, are installed in the different shelves in the different racks. In the embodiment illustrated, most of the aforesaid shelves are equipped with a heat exchanger 13, and the new apparatus functions more effectively the more shelves are equipped with heat exchangers. 60-100% of the shelves should preferably be equipped with heat exchangers. In the middle racks shown schematically in FIG. 1, units or compartments 14 (not specified in any greater detail here) are installed in the lower parts. These compartments are not equipped with heat exchangers. The same applies to all bottom compartments 6a' in the various racks. Instead, the top compartment is equipped with two heat exchangers, one of which, designated 13', is mounted in the ceiling of the compartment, where it provides good cooling capacity, since the air is hottest at the top of the rack. The aforesaid heat exchangers are primarily installed in compartments or shelves that are intended to carry magazines of known type for boards with printed wiring and various types of components (relays, condensers, resistors etc.). In the case of the invention, however, most of the shelves in the racks (e.g. more than 75%) shall be equipped with a heat exchanger. The heat exchanger can thereby be integrated with the shelf or constitute a separate part in relation to the shelf, whereby in the latter case the heat exchanger is attached to the rack itself. The rack is equipped with two vertically running pipelines or coolant lines 15 and 16. The inlet connections to the heat exchangers' tubular coils are connected to the first pipeline 15, while the outlets from the heat exchangers' tubular coils are connected to the second pipeline 16. The pipelines 15 and 16 in the different racks are connected in parallel to a tubular evaporator or fluid cooler 17 of known type. In the fluid cooler, the tubular evaporator is indicated by 17a and the compressor by 17b. The compressor is connected to a condenser or water recooler located outside of the premises via a line 17c for the refrigerant. In the case shown here, the tubular evaporator has been connected to the same condenser or water recooler as the refrigerator module 7, but can otherwise be connected to a separate condenser or water recooler. The piping system that includes the first and second pipelines 15 and 16 to the various racks is connected to the tubular evaporator's inlet 17a' and outlet 17a". The pipelines can also be connected in series, depending on the diameter of the tubing used. A pump 18 of known type is incorporated on the pressure side of the piping system. The fan's 7d outgoing air flow is kept to a temperature of about +8° C. in order to minimize the water content of the supply air to about 6.5 grammes of water per kg of air. This is done in order to dry the air so that water does not condense on the outer surfaces of the heat exchangers. The air entering the air duct from the fan outlet can, owing to the ejector effect, entrain room air and thereby assume a temperature of +15° to 16° C.

The coolant in the piping system should preferably consist of freon in the liquid state, which is thus cooled in the fluid cooler 17 and circulated in the piping system by the pump 18. In the case illustrated here, the fluid has an inlet temperature at 17a' of up to +30° C., while its temperature at the outlet 17a" can be about +15° C. Circulation in the system is indicated by arrows 19 and 20.

The upward and preferably dry air streams 12a, 12b, 12c and 12d in the different racks thereby pass the heat exchangers' cooling flanges on the shelves equipped with heat exchangers, while absorbing heat from the racks. As shown by arrows 12c and 12f, air eddies are also created in the rack. An example of the velocity of the fluid in the closed piping system is 0.2 to 0.4 m/s. The piping system and the tubular coils in the heat exchangers consist of copper tubing with an inside diameter of about 10 mm. The velocity of the upward air streams in the racks is 1 to 5 m/s. The temperature on the premises can be +23° to 24° C.

Figure 2:
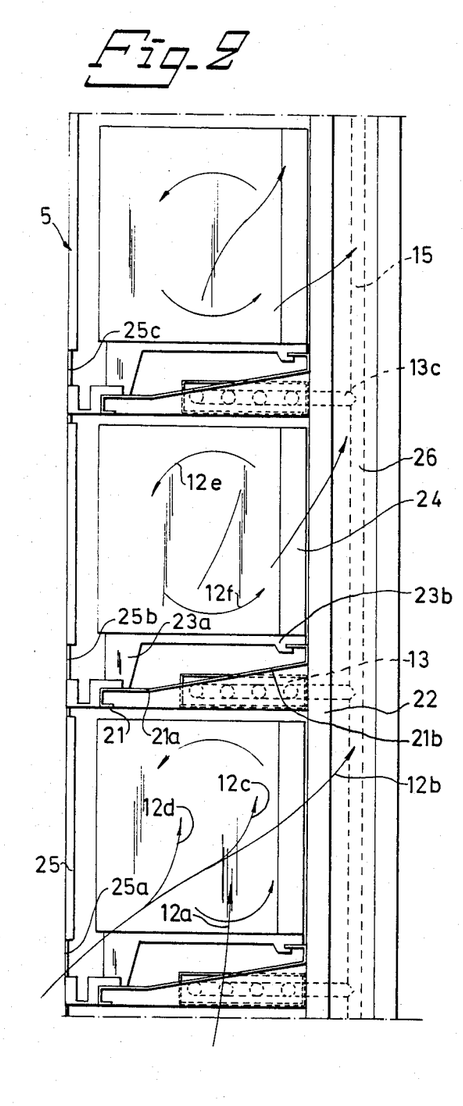
FIG. 2 shows, in an end view, parts of a rack according to FIG. 1.

FIG. 2 shows three compartments in a rack 5. For each shelf, a side piece 21 is shown, which is fitted at the rear of the rack with hook devices 27 (not shown) in FIG. 2 by means of which the shelf can be attached to the rack posts 22 on either side of the shelf. The aforesaid rack posts are provided with slots into which the aforesaid hook devices can be inserted and secured in known manner. At its inner and outer ends, the shelf bears the bracket that supports the lower parts 23a and 23b of a board magazine that carries the boards standing on end. FIG. 2 shows a board, indicated by 24. The boards are mounted in the magazine with intervening spaces, and each board carries components (not shown) and printed wiring on one or both sides. Since the constructions of the shelf, the board magazines and the boards are presumed to be known, they will not be described in any greater detail here. It can however be stated that the shelf consists of, besides the aforesaid side pieces 21, a load-bearing surface which, in the view shown in FIG. 2, is composed of two flat sections 21a and 21b which meet each other at an angle. For the future, a shelf design is being discussed with a single surface that runs essentially perpendicular to the vertical direction of the rack. This surface can be assumed to coincide with the left-hand flat portion 21a of the shelf's load-bearing surface. The invention also applies for other shelf planes, however, for example planes that coincide essentially with the section 21b. The upward air stream in the rack is divided as shown in FIG. 2 into a number of substreams 12a, 12b and 12c. The rack can be equipped with a section 25, provided with a number of slots for air that flows upward from the lower parts of the rack and via the slots into the rack shelf in question. In the embodiment shown, a single slot section 25a, 25b, 25c is provided at each shelf respectively. At the lowest shelf, the air flows in from the cooling duct via the slots into the adjoining section and then upward between the aforesaid boards. Air also enters at the overlying shelves via their slot sections. The air flowing upward in the rack passes through the opening of the shelves with their heat exchangers 13 and continues up through the lower parts of the board magazines and up between the boards to the overlying parts, and so on. Except for the aforesaid rack posts 22, the rack is completely open in back, and a chimney duct 26 is provided at the rear of the rack, in which some of the air can escape on its passage upward through the rack. The upward and backward sweeping air stream created in this fashion provides good cooling, especially at the rear parts of the rack, which are the most critical from the viewpoint of cooling.

Figure 3:
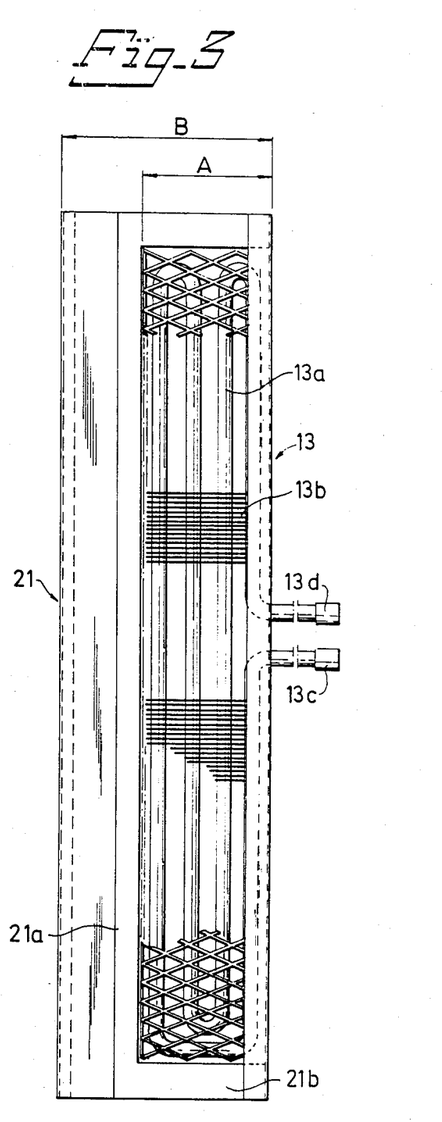
FIG. 3 shows, in a horizontal view, a heat exchanger mounted in a shelf in the rack according to FIG. 2.

FIG. 3 shows the shelf 21 in a horizontal view from above. As is evident from the figure, the flat or sloping portion 21a, 21b contains the cavity for the heat exchanger, which is of the type that incorporates a tubular coil 13a with attached cooling flanges 13b. The heat exchanger has a large extent in the plane shown in FIG. 3 and occupies a large part of the plane area of the shelf in question. As an example of what is meant by "a large part" in this case, it can be mentioned that the heat exchanger shall occupy 60–90% of the plane area of the shelf in question. The heat exchanger exhibits a depth A equal to about ⅔ of the depth B of the shelf. The heat exchanger extends from the rear parts of the rack (the beams 22) towards the front of the rack. Owing to its relatively far retracted position in the rack, the heat exchanger provides an effective cooling function at the same time as the shelf retains a reliable load-bearing function. The heat exchanger can be attached to the shelf and/or the rack. The points of attachment have extensive contact surfaces that ensure good heat conduction from the warmer parts of the shelf and/or the rack to the colder surfaces of the heat exchanger. The tubular coil 13a is fitted with an inlet connection 13c and an outlet connection 13d which, in accordance with the above, shall be connected to the first and second pipelines. The aforesaid first and second pipelines can be run in the aforesaid chimney duct 26. Parts of the first pipeline's 15 run in the aforementioned duct 26 have been indicated in FIG. 2. The tubes in the aforesaid tube coil in the heat exchanger extend primarily in the transverse direction of the shelf along most (at least one-half of the length) of the aforesaid transverse direction. In the embodiment shown, the aforesaid tubular coils extend along about 90–95% of the shelf's transverse direction. The cooling flanges or fins on the heat exchanger can be square, circular or of another shape.

Figure 4:
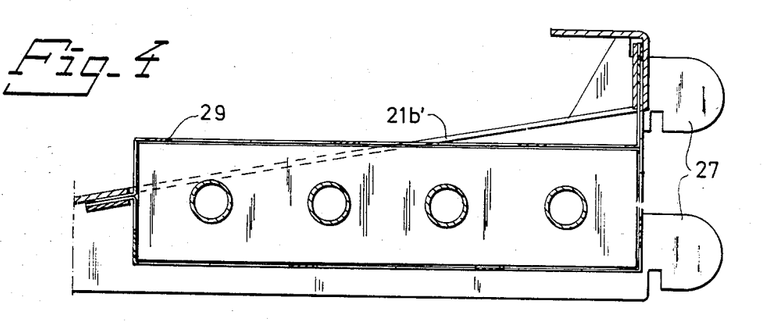
FIG. 4 shows one embodiment of the heat exchanger and its mounting in a shelf in the rack.
Figure 5:
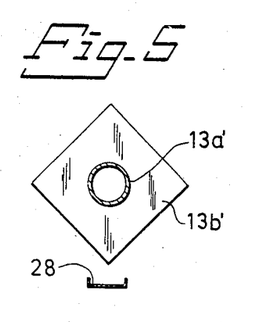
FIG. 5 shows, in an end view, an alternative embodiment of the heat exchanger.
Figure 6:
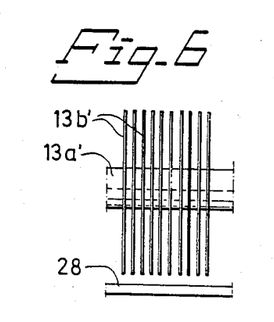
FIG. 6 shows a detailed view of a tube incorporated in the heat exchanger according to FIG. 5 and cooling flanges or fins arranged around this tube, with drop-collecting edges and drip tray.

FIGS. 5–6 are intended to illustrate an alternative embodiment of the heat exchanger and its application to the shelf, whose sloping portion 21b' is indicated in FIG. 4. In this case, the hook devices 27 on the shelf, by means of which the shelf is attachable to the rack posts 22, are also shown. The heat exchanger's cooling flanges are of square shape, in this case and are rotated 45° around their longitudinal axis in relation to the embodiment according to FIG. 4. In addition, the edges of the cooling flanges are upset or bent in order to provide drop collectors, and a drip tray 28 is provided under the heat exchanger. This embodiment may be appropriate when water can be expected to condense on the heat exchanger surfaces during the cooling process. This may occur when the air on the premises is relatively humid, for example because the outdoor humidity is in itself high and corridors and other passageways have stood or are standing open into the premises. Condensate may also form on the surfaces when high cooling capacities are desired from the cooling apparatus. Any moisture on the outside of the cooling flanges can run down along the edges of the cooling flanges to the lowermost corner, under which the drip tray 28 is arranged. The drip tray can lead to one or more containers (not shown).

The heat exchanger is also provided with a protective grille or screen 29 so that piping can be run within the rack regardless of the aforesaid heat exchangers. The grille or screen is thereby designed as a heat-transfer member so that heat is conducted between the heat exchanger and the screen or grille, from which the heat can be conducted to the shelf and/or the rack. The extensive heat-conducting metallic contact surfaces between the grille/screen and the heat exchanger shall thereby be made relatively large in order to facilitate such heat conduction. The heat exchanger is made with an effective cooling surface of up to 2.0 m$^2$ or more.

The apparatus described above can also be employed to advantage in premises that have an air treatment unit separate from the apparatus, intended to bring about hygienically acceptable air conditions on the premises and, in some cases, to humidify and/or dehumidify the air on the premises.

The shelf cooling function can, however, also function completely separately or essentially separately as per the following. Parts of a rack row at a telecommunications exchange are indicated by 101 in FIG. 7. The rack construction is of known type and has been supplemented with a cooling apparatus according to the invention. The rack row contains a number of racks 102, 103, 104 etc. and may form single or double racks. In addition to its frame with loadbearing beams 105, 106 and end and front sheets 107, 108, each rack is provided with a number of shelves 109, arranged on top of each other, whose number in the case in question is eight. Telecommunications equipment is arranged on the shelves. The aforesaid telecommunications equipment can thereby consist of circuit boards 111 arranged on end in board magazines 110 in known manner. Most of the shelves in a rack may carry such board magazines, while one or more shelves may carry other types of equipment, such as transformers, power supply components etc.

Most of the shelves in each rack shall preferably be integrated each with its own heat exchanger 112. In the case in question, all shelves in the rack 102 are equipped with such a heat exchanger. Each shelf with appurtenant heat exchanger is thereby integrated in such a manner that the load-bearing capacity of the shelf is not unduly affected. Each heat exchanger is equipped with one or more tubular coils. In the case in question, each heat exchanger has been equipped with one tubular coil, whose inlets and outlets are designated 112a and 112b in FIG. 7. The aforesaid tubular coils are connected to lines 113 and 114, to which the corresponding inlets and outlets on the tubular coils in the other heat exchangers are also connected in such a manner that a common or continuous piping system is obtained.

Figure 7:
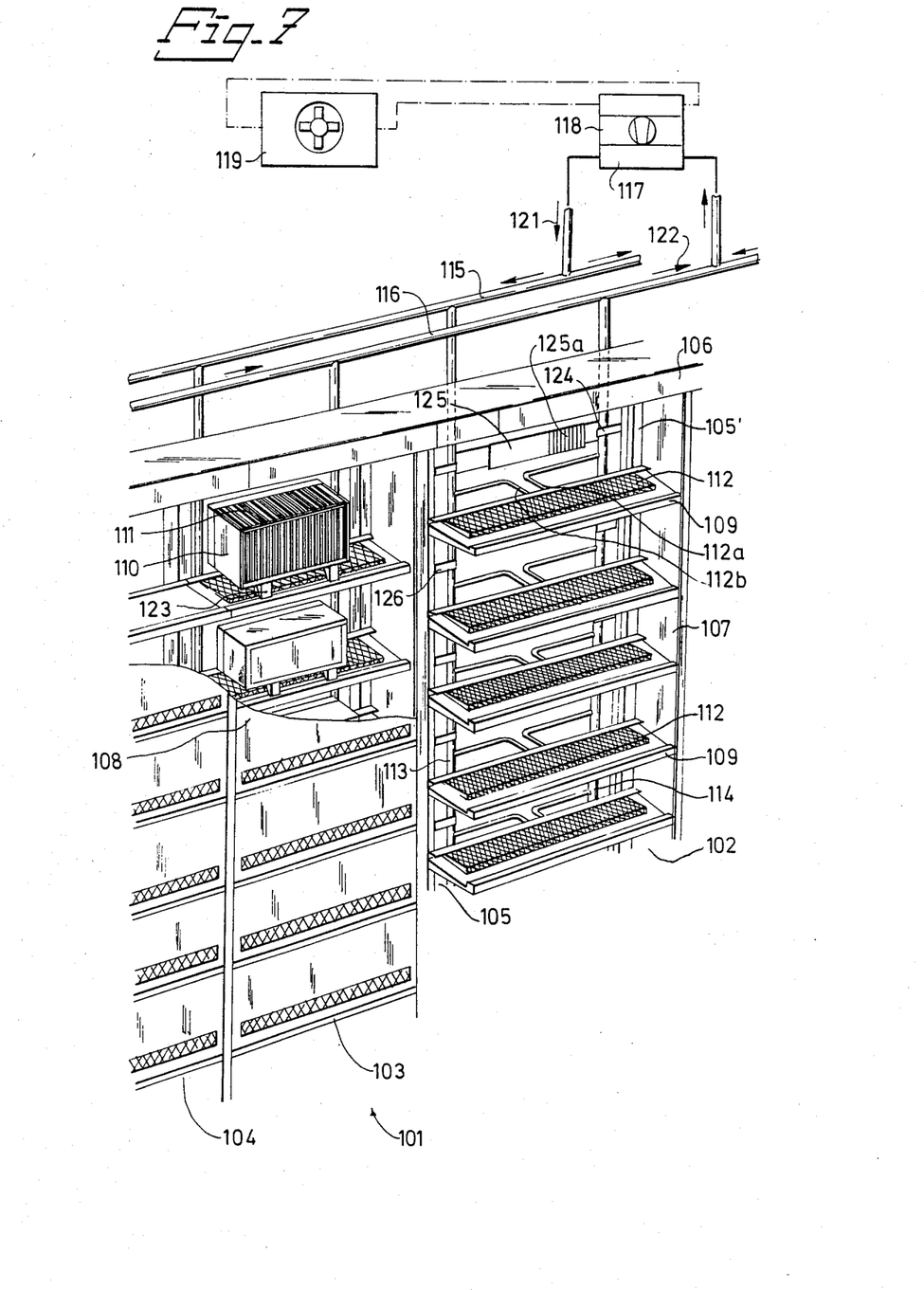
FIG. 7 shows, in perspective viewed from in front and above, certain parts of a second embodiment of a rack utilizing the apparatus, in which another embodiment the shelf cooler provides the cooling function essentially autonomously, i.e. without the aid of e.g. the row cooler in FIGS. 1–2.

The aforesaid piping system thereby comprises vertical first lines 113 and 114, which in turn are connected to horizontal second lines 115 and 116. The vertical lines link the heat exchangers within the same group together, while the horizontal lines connect the heat exchangers in the different racks. A coolant, which consists in the present case of chlorofluorocarbon in liquid form, circulates in the aforesaid tubular coils and lines 113, 114 and 115, 116. Naturally, other coolants may also be used for this purpose. The lines 115 and 116 are also connected to a fluid cooler 117, which is included in the refrigeration equipment employed, together with a compressor 118 and a condenser 119. The cooler 117 with compressor 118 may take the form of a tubular evaporator or a fluid cooler. The condenser (or water recooler) should preferably be located outside of the premises or work space in which the rack or racks in question are set up. The aforesaid refrigeration equipment is of the kind that is available on the general market, and an example of such equipment is Stal-VMR (series 100), which is supplied by Stal Refrigeration AB, Sweden. The refrigeration equipment does not include circulation devices for the coolant (not shown here), and the directions of circulation are indicated by arrows 121 and 122, whereby direction 121 is the outgoing direction from the fluid cooler 117 and 122 is the incoming direction. The flow velocity of the coolant is dependent upon the capacity with which heat exchangers are to operate in the racks. 0.2 to 1.5 m/s is a typical velocity of the coolant. The piping system and the tubular coils in the heat exchangers consist of tubing of e.g. copper with an inside diameter of about 10 mm. The aforesaid coils and piping system are arranged in such a manner that the throughput rate in the different heat exchangers is roughly the same.

The aforesaid board magazines, which will be described in greater detail below, are applied to their respective shelves via brackets or cantilever supports 123, whose detailed design is also described below. Special arrangements have been made in order to achieve extensive contact surfaces between different parts of the rack. Thus, as shown in FIG. 7 there are extensive metallic contact surfaces at each shelf between the rack post 105' and the incoming coolant line 114. These metallic contact surfaces are situated on a metal plate or a metal band 124 or similar device which is attached both to the aforesaid post 105' and the aforesaid line 114. A metal plate or a metal band 125 is also arranged at each shelf between the two lines 113 and 114 for the coolant so as to comprise a heat-transfer member. The device 125 is equipped with flanges or fins 125a. The device 125 is further arranged so that it makes contact with the back surfaces of the board magazine when the board magazine with boards is placed on the shelf in question. A device 126 corresponding to device 124 is connected between the post 105 and the line 113 at each shelf. The magazine therefore is supported by the underlying heat-transfer member 123 and by the rearward heat-transfer member 125.

Figure 8:
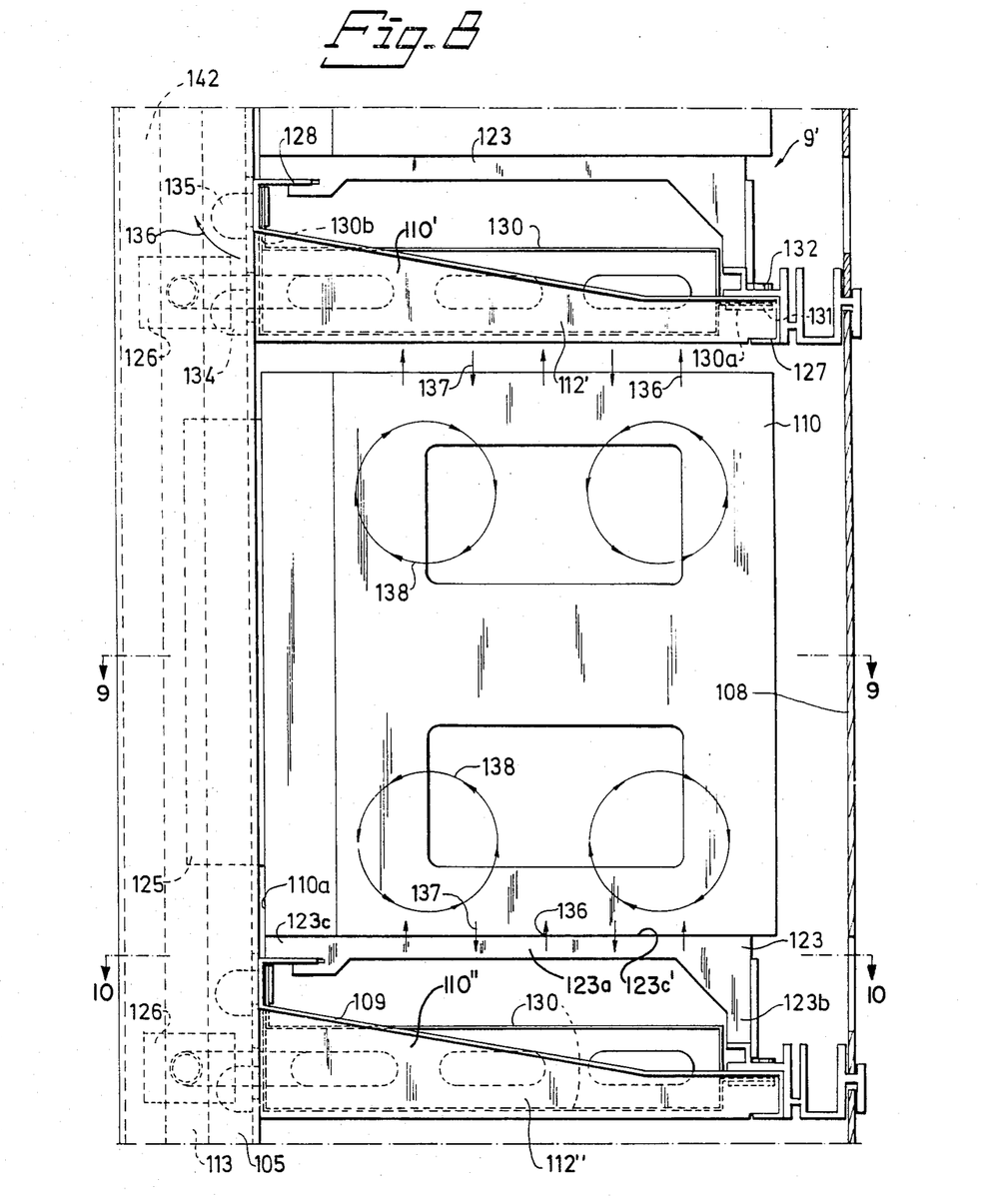
FIG. 8 shows, in a side view, shelves in a rack according to FIG. 7 with appurtenant board magazines for printed circuit boards.
Figure 9:
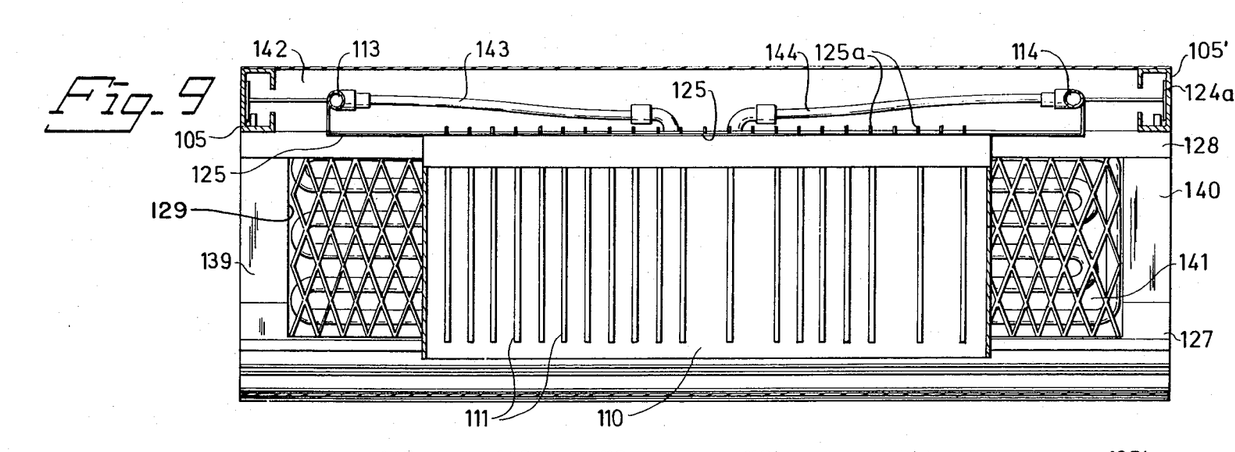
FIG. 9 shows, in a horizontal section, the design of the board magazines, the shelf and the rack according to line 9—9 in FIG. 8

FIG. 8 shows two shelves 110' and 110'' placed on top of each other in a rack according to FIG. 7, each shelf with its own heat exchanger 112' and 112'', respectively. Each shelf incorporates two parallel load-bearing parts 127 and 128 (see also FIG. 9). Between these load-bearing parts, a cavity or opening 141 is provided, as shown in FIG. 9. The heat exchanger 112' or 112'' in question is mounted in this cavity. The heat exchanger is thereby mounted in a holding device, which preferably takes the form of a screen or grille 130 extending around the entire circumference of the heat exchanger. Along its long sides, as shown in FIG. 8, the holding device 130 is provided with fastening pieces 130a and 130b, by means of which the holding device is fastened to the load-bearing parts 127 and 128. Thus, the fastening piece is fastened to the load-bearing part 127 by means of channels 131, which are screwed in place or otherwise fastened by means of screws or the equivalent, one of which is shown at 132 in FIG. 8, to the load-bearing part 127 so that an extensive contact surface is obtained between the fastening piece 130a and the load-bearing part 127. The aforesaid load-bearing part preferably consists of an extruded beam of aluminum or other metallic device so that it serves as a heat-transfer member. The fastening piece 130b is attached to the load-bearing part 128 by means of a long channel, which is attached to the load-bearing part 128 by means of screws or equivalent fasteners (not shown), whereby the piece 130b is wedged between the clamping channel and the surface of the load-bearing part. The shelf is provided with bracket-shaped side pieces that incorporate projecting devices 134, 135, which are inserted in corresponding slots on the concerned rack post 105 and are designed to such a manner that, after being inserted in the slot, they lock to the post to provide appropriate support for the shelf with appurtenant heat exchanger, board magazines and boards.

The design of the cantilever support (see also FIG. 7) is shown in greater detail by FIG. 8. The cantilever support has a middle section 123a that reaches across the aforesaid cavity 141 between the load-bearing parts 127 and 128 of the shelf. The cantilever support is anchored at its ends 123b and 123c to the load-bearing parts 127 and 128. The contact surfaces between the aforesaid free ends 123b and 123c on the one hand and the load-bearing parts 127 and 128 on the other hand are also extensive. The board magazines 110 are placed on the aforesaid cantilever supports 123a, whose top surfaces 123c' have been made extensive in the horizontal plane. The board magazines have a back piece, to which box-shaped or cassette-shaped pieces are applied, in which the circuit boards are placed on end. Receptacles in which the boards can be connected via matching plugs are provided on the front side of the back piece. The box-shaped part on the board magazine is connected via its back surface 110a to the device 125, which thereby extends along a large part of the height of the board magazine.

The aforesaid back piece and board magazine boxes are made with slits and/or cutouts so that free air circulation is obtained between the circuit boards placed on end in the board magazines with their components. The convection that is brought about owing to, inter alia, the cold surfaces of the heat exchangers and the hot components gives rise to air currents past the components on the boards and removal of the heat generated in the components by the air currents. Such air currents between the boards in the board magazines are indicated in FIG. 8 by first arrows 136, which symbolize the upward air current. Second arrows 137 symbolize downward air currents, while third arrows 138 symbolize circulating air currents between the boards. In addition, heat dissipation is obtained by direct radiation from the hot board surfaces onto the heat exchangers 112' and 112''. The aforesaid extensive metallic contact surfaces of the heat-transfer members contribute appreciably to heat transport from the boards/magazines to the colder surfaces on the heat exchangers.

The heat exchangers in a rack are thereby designed with such large effective cooling surfaces that cooling capacities in excess of 150 Watts are obtained from the heat exchangers. It can hereby be mentioned that cooling capacities of 500 Watts or higher from each heat exchanger are within the realm of possibility. Thanks to the specific integration between each shelf anditsheat exchanger, a large effective cooling surface can be obtained in the shelf. 1.5 to 4.0 m$^2$ can be mentioned as an example of the size of an effective cooling surface.

The integrated cooling function with heat conduction via the contact surface, radiation and natural convection can be provided with the proposed principle in such a manner that, despite a high packing density of the boards and their components, the maximum component temperature on each board can be limited to about 75° C. In one proposed embodiment, however, it is proposed that the heat exchangers be arranged and operated in such a manner that maximum component temperatures of about 65° C. or lower are obtained.

FIG. 9 shows, inter alia, the connection of the devices 124 and 125 to the coolant lines 113 and 114. The devices 124 are connected via extensive contact surfaces 124a to the rack posts 105 and 105'. The side pieces on the shelf are indicated by 139 and 140 and the cavity between the loadbearing parts 127 and 128 is indicated by 141. The rack has a chimney-like duct 142 at the back, which contains the aforesaid lines 113 and 114 and the connections 112a, 112b on the heat exchangers (see also FIG. 10). The lines between the connections 112, 112a, 112b and the vertical pipes 113 and 114 are lines 143 and 144. The board magazines 110 are shown schematically, since they are assumed to be of known type.

Figure 10:
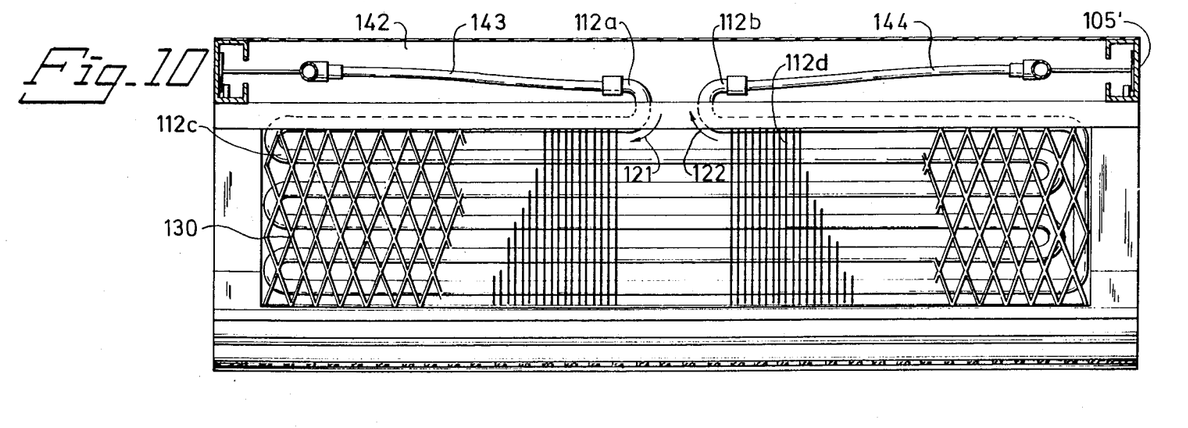
FIG. 10 shows, in a horizontal section, the extent of the heat exchanger in the shelf according to line 10—10 in FIG. 8.

FIG. 10 shows the extent of the heat exchanger in the horizontal plane of the shelf and its mounting in the cavity 141. The heat exchanger occupies a large part of the shelf's horizontal plane, for example 60 to b 90%. The heat exchanger runs underneath the board magazines and extends over the greater part of their depth. Thus, the heat exchanger has a depth which is preferably 70 to 95% of the depth of the board magazines. In this manner, the heat exchanger can be made to act indirectly over the entire depth of the board. The temperature of the coolant entering the fluid cooler 117 can be up to about +30° C. The temperature of the outgoing coolant from the cooler can be down to +15° C.

The invention is not limited to the versions described above as examples, but can be subject to modifications within the framework of the following patent claims and invention concept. Values of temperature, cooling surface etc. can, for example, vary from one embodiment to another.

I claim:

1. Apparatus in a work space cooling telecommunications equipment consisting of component-carrying printed circuit boards arranged in board magazines, comprising a rack having shelves arranged on top of one another in said rack at least one shelf having an individual heat exchanger which incorporates cooling flanges and at least one tubular coil, a cooler having lines connected to the heat exchanger to cause a coolant to run in the tubular coil; the heat exchanger, viewed in the horizontal plane of its shelf extending along at least one half the length of the shelf; and at least one heat-transfer member having extensive heat-conducting metallic contact surfaces arranged to contact the board magazine and mounted in heat-transfer relation to the associated shelf as well as the heat exchanger; at least a part of said heat-transfer member supporting said magazine to assure heat transfer from said magazine to said member, so that said heat exchanger and cooler contribute towards removing the heat given off by the telecommunications equipment by means of heat conduction through said extensive contact surfaces, independent of packing density of the aforesaid telecommunications equipment in the rack and the rate of heat emission.

2. Apparatus according to claim 1, wherein at least half of the rack's shelves have an individual heat exchanger integrated with the shelf, each of the heat exchangers having tubular coils interconnected with the coils of the other heat exchangers and connected to said cooler.

3. Apparatus according to claim 1 wherein said heat-transfer member comprises a metallic heat conducting device connected between the cooler lines, the shelves, and the rack, and positioned to contact the board magazine.

4. Apparatus according to claim 3 wherein said device is disposed vertically at the back of the shelf, and has fins projecting forwardly therefrom.

5. Apparatus according to claim 1 wherein said shelf has a central opening therethrough, said heat exchanger being mounted in said opening, said heat-transfer member comprising a perforate grille contacting said cooling flanges and spanning across said opening so as to afford airflow upwardly through said opening and over said cooling flanges and coil and through said grille.

6. Apparatus according to claim 5 wherein said rack is set up in the work space to afford flow of air from the work space through the rack, the rack with its shelf-integrated heat exchanger functioning as a cooling device for the work space where the rack is set up, while simultaneoulsy bringing about cooling of the telecommunications equipment in the rack.

7. Apparatus according to claim 6 wherein the work space incorporates a cooling system having an air source and an air duct open underneath the rack arranged so that an upward air stream is created within the rack, where it passes through the openings of different shelves and emerges at the top part of the rack into the atmosphere of the work space; at least half of the rack's shelves having a heat exchanger extending over at least half of the area of the shelf that is perpendicular to the vertical direction of the rack, the aforesaid upward air stream in the rack passing over the cooling flanges on the heat exchangers in the shelves provided with heat exchangers.

8. Apparatus according to claim 5 wherein said opening extends in the horizontal plane, said shelf including a holding device mounting the heat exchanger in the shelf, said device consisting of a screen connected to the body of the shelf along its two long sides to comprise said heat transfer member.

9. Apparatus according to claim 8, characterized in that the shelf incorporates two essentially parallel load-bearing parts between which said opening extends; cantilever supports arranged on the load-bearing parts so that their middle sections extend across the opening adapted to carry on their middle sections one or more board magazines; said heat transfer member including the holding device and the cantilever supports providing effective heat conduction between the interiors of the board magazines where the boards are placed on end and the heat exchanger.

10. Apparatus according to claim 9 wherein said load bearing parts extend downwardly and outwardly from the back of the rack, said heat exchanger being mounted between said parts with its holding device surface horizontal, such that the rearward part of said holding device is situated within said opening below the load-bearing part and the forward part of the holding device is situated above said opening and the load-bearing part.

11. Apparatus according to claim 5 wherein said rack is set up in the work space, said apparatus including an air source for generation of an upward air stream through the rack and a refrigeration module having a cooling coil for said air stream, a compressor and a fan in the work space and a condenser or water recooler outside the work space.

12. Apparatus according to claim 11, wherein the refrigeration module in the work space is connected to the heat exchanger on said shelf, and comprises said cooler for supplying coolant to the coils thereof.

13. Apparatus according to claim 5 wherein said shelves on the rack are arranged to cause upward air flow to pass upwards between the boards in the magazines and out, said apparatus including a chimney duct at the rear of the rack to receive said out flow, the heat exchangers extending from the rear of the rack in the direction towards the front of the rack so as to occupy about ⅔ of the shelf's depth, providing favorable cooling at the rear portions of the rack.

* * * * *